United States Patent [19]

Tubergen et al.

[11] Patent Number: 4,610,895

[45] Date of Patent: Sep. 9, 1986

[54] PROCESS FOR METALLIZING PLASTICS

[75] Inventors: Timothy S. Tubergen, Northbridge; Terrell A. Benjamin, Acton, both of Mass.

[73] Assignee: Shipley Company Inc., Newton, Mass.

[21] Appl. No.: 711,499

[22] Filed: Mar. 14, 1985

Related U.S. Application Data

[62] Division of Ser. No. 575,872, Feb. 1, 1984, Pat. No. 4,592,929.

[51] Int. Cl.$^4$ .............................................. C23C 18/24
[52] U.S. Cl. ...................................... 427/98; 427/244; 427/306; 427/307
[58] Field of Search ................. 427/306, 98, 304, 244, 427/307; 134/27, 28

[56] References Cited

U.S. PATENT DOCUMENTS

| | | | |
|---|---|---|---|
| 3,682,671 | 8/1972 | Zeblisky | 106/286 |
| 3,962,497 | 6/1976 | Doty et al. | 427/306 |
| 4,042,729 | 8/1977 | Polichette et al. | 427/304 |
| 4,073,740 | 2/1978 | Polichette et al. | 252/156 |
| 4,204,013 | 5/1980 | Arcilesi et al. | 427/304 |
| 4,322,457 | 3/1982 | Baron et al. | 427/305 X |
| 4,378,384 | 3/1983 | Murami et al. | 427/98 X |
| 4,448,811 | 5/1984 | Doty et al. | 427/306 X |
| 4,472,205 | 9/1984 | Cortner | 134/27 |

OTHER PUBLICATIONS

Latimer et al., "Reference Book of Inorganic Chemistry", third edition, New York, The MacMillan Company, 1953, pp. 199-200.

Primary Examiner—Evan K. Lawrence
Attorney, Agent, or Firm—Robert L. Goldberg

[57] ABSTRACT

A process for the metallization of a plastic by electroless deposition, wherein the plastic surface is contacted with a solution useful for the treatment of oxidant residue following contact of the surface with an oxidizing solution such as a hexavalent chromium or permanganate solution. In one embodiment, the solution comprises a reducing agent, a pH adjuster and a surface active agent in a concentration sufficient to reduce the surface tension of the solution preferably to 50 dynes per square centimeter or less at the operating temperature of the solution. In a second embodiment, the solution consists essentially of the surface active agent in a concentration sufficient to achieve the above surface tension range.

16 Claims, No Drawings

PROCESS FOR METALLIZING PLASTICS

This is a division of application Ser. No. 575,872 filed 2/1/84 now U.S. Pat. No. 4,592,929.

BACKGROUND OF THE INVENTION

1. Introduction

This invention relates to the metal plating of plastics and more particularly, to a novel solution useful for the removal of oxidation residues in a process for plating plastics by electroless deposition where entrapment of solution in capillaries is a problem.

2. Description of the Prior Art

It is known in the art that plastics may be plated with metal for a variety of purposes. For example, two major uses of metal plated plastics are for decoration and for the fabrication of electronic devices. An example of a decorative use includes automobile parts such as trim. Examples of electronics uses include printed circuits, where the metal plate in a selective pattern comprises the conductors of the printed circuit board, and metal plated foam used for EMI shielding. ABS resins are the most commonly plated plastics for decorative purposes while phenolics and epoxies are the most commonly plated plastics for the fabrication of printed circuit boards. In general, a process for metal plating a plastic by electroless deposition may include a first step of solvent treatment followed by the steps of oxidation to render the surface of a plastic part hydrophilic and therefore adsorbtive of a plating catalyst, catalysis to render the plastic catalytic to electroless metal deposition and metal plating comprising electroless metal deposition optionally followed by electrolytic deposition to provide a decorative finish and/or increase the thickness of the metal plate.

The bond strength between the metal plate and the plastic is of prime importance to the final product whether the product is decorative or a printed circuit. If a plastic is plated by a process involving only the steps of cleaning, catalysis and plating, the resultant bond strength between the part and the metal plate will be minimal and unacceptable for the majority of commercial applications. Consequently, much research has been devoted to processes for pretreatment of plastics prior to plating, all with the object of increasing bond strength between the plastic and the metal plate. The majority of these processes include the sequential steps of solvent treatment and oxidation. An early publication disclosing a process for preparing a plastic for metal plating is Narcus, *Metallizing Of Plastics*, Reinhold Publishing Corporation, New York, 1960, Chapter 2. In this publication, it is taught that the plastic part is treated with an oxidizing solution of sulfuric acid and a source of hexavalent chromium ions. An early patent showing solvent pretreatment followed by a chromic acid oxidative etch is U.S. Pat. No. 3,574,070 where the first treatment step comprises solvent treatment with an aqueous emulsion of a solvent followed by treatment with a hexavalent chromium solution. Patents showing pretreatment of specific plastics include U.S. Pat. Nos. 3,445,350; 3,598,630 and 3,769,061, each for ABS; U.S. Pat. No. 4,125,649 for polysulfone; and U.S. Pat. No. 4,315,045 for polyamides.

In commercial practice, essentially all processes utilize a chromic acid solution as a source of hexavalent chromium for the step of oxidation. A typical chromic acid solution is disclosed in Example I of the above identified U.S. Pat. No. 3,445,350 incorporated herein by reference. However, it is known in the art that the use of a chromic acid etchant has serious drawbacks including the toxicity of chromium compounds which makes their disposal difficult; chromic acid residues on the plastic surface that inhibit electroless deposition; and the difficulty of rinsing chromic acid residues from the plastic surface following treatment.

Attempts have been made in the prior art to substitute other oxidants for the hexavalent chromium solutions. The most commonly proposed oxidant is a potassium permanganate solution as suggested in U.S. Pat. No. 3,625,758 where an acid permanganate solution is disclosed. A more recent attempt at such substitution is disclosed in U.S. Pat. Nos. 4,042,729 and 4,073,740 incorporated herein by reference. In these patents, instability of prior art acid permanganate solutions is identified as the problem associated with the use of such solutions and in accordance with the teachings of said patents, solution stability is achieved by use of a permanganate solution where the molar ratio of manganate ion to permanganate ion is not allowed to exceed 1.2 while the pH of the solution is adjusted between 11 and 13. An improvement in the use of permanganate solutions is disclosed in commonly assigned, copending U.S. patent application Ser. No. 542,036 filed Oct. 14, 1983.

Regardless of whether the oxidant solution is a hexavalent chromium solution or a permanganate solution, contact with the solution leaves an oxidant residue on the surface of the plastic part that acts to poison the catalytic surface interfering with metal deposition and often resulting in void formation. Using either a hexavalent chromium solution or a permanganate solution, a simple water rinse is inadequate to remove the residue and the art has resorted to a further step of contact with a solution of a reducing agent though more chemistry is involved in removal than simple reduction. Removal of permanganate residue with a reducing agent is disclosed in the above referenced U.S. Pat. Nos. 4,042,729 and 4,073,743.

When capillary geometries are on or adjacent to the plastic part to be plated, such as the micropores found in plastic foam, the problem of oxidant poisoning is increased. Capillary forces draw and retain oxidant solution and residue into the pores resulting in a high concentration of both retained in the foam following contact with the oxidant solution. These materials diffuse from the capillaries during subsequent plating steps resulting in areas surrounding the capillaries contaminated with oxidant solution and residue that inhibits plating. This results in the plated part having unplated areas (voids) over its surface where diffusion of oxidant and residue have taken place. It should be noted that a foamed plastic generally has a non-porous layer over its surface as a consequence of the molding operation during the formation of the foamed plastic. Therefore, it would be expected that the pores would not be adsorbent of the plating chemicals. However, it has been found that the non-porous surface layer is inadequate to withstand the treatment chemicals and the solutions do attack this layer resulting in diffusion of the chemicals into the subsurface pores and the resultant problems described above are encountered in the plating of foam. The demand for metal plated plastic foam is increasing because of the use of such materials as a shielding to prevent EMI leakage from electronic equipment. Consequently, the art is searching for an improved method for removing oxidant solutions and residue from the surface of a plastic part following treatment with an oxidant solution.

Another problem in the art associated with the entrapment and subsequent diffusion of oxidant and residue from capillaries is associated with the racks used to carry the plastic part through the plating sequence. These racks are often metal that is coated with a plastisol that resists plating. The ends of the racks are stripped of the plastisol coating to expose the metal and hold the plastic part on the rack. The exposed metal acts as the cathodic contact for a subsequent electroplating step. In this way, following electroless metal plating, the part may be electroplated without reracking because the metal contact holding the part acts as the electrode. The difficulty associated with the use of these racks is similar to that with foam. Capillary action draws oxidant solution into the interstices between the exposed metal and its plastisol coating. During the plating sequence, oxidant solution and residue diffuse from these interstices poisoning the plastic surface adjacent the point of contact with the rack. This often results in the formation of a void for the same reasons as described above. The void acts as an electrical barrier between the rack at its point of contact with the plastic part and the metal plate that interferes with electroplating of the part or causes other related difficulties. Void formation may result in rejection of from about 1 to 15 percent of the plated parts where racks and contacts are used as described.

SUMMARY OF THE INVENTION

The subject invention provides a process for the metallization of a plastic by electroless deposition, wherein the plastic surface is contacted with an improved solution useful for the treatment of oxidant residue following contact of the surface with an oxidizing solution such as a hexavalent chromium or permanganate solution. The solutions used in the process of the invention are especially useful for the removal of adsorbed oxidant solution and residue from capillaries which entrap the same such as the pores of plastic foam or the interstices between the metal core and plastisol coating of a rack that carries a plastic part through a plating sequence. Accordingly, the solutions significantly reduce the incidence of void formation associated with diffusion of oxidation solution and residue in processes for the metal plating of plastics using a step of treatment with an oxidizing solution.

The use of the preferred solutions used in the process of the invention also provides an additional unexpected result. A problem in the art relates to the plating of the racks that carry the plastic part through the plating sequence. It is known that notwithstanding the plastisol coatings on the racks, use of a rack often leads to metal depositing onto the racks. However, when the racks carry a plastic part through a plating sequence that includes a step of oxidation, the oxidant chemisorbs onto the surface of the rack and acts as a plating poison. It would be expected that the solution formulated to remove oxidant adsorbed into capillaries would also remove chemisorbed oxidant on the racks. However, in practice, it has been unexpectedly found that treatment with the solutions of the invention removes entraped oxidant from the capillaries or pores without removing chemisorbed oxidant on the surface of the plastisol coating. This chemisorbed oxidant inhibits plating and consequently, when a racked part is treated first with an oxidant solution and then with the solution of the invention, catalysis and metal plating will result in metal plating onto the plastic part, but not onto the racks.

The solutions used in the process of the invention in one embodiment comprise an aqueous solution of a reducing agent, a pH adjustor, and a surface active agent, where the aqueous solution has a surface tension reduced from that of an equivalent treatment solution free of the surface active agent. Preferably, the surface tension does not exceed 50 dynes per square centimeter at the operating temperature of the solution as a result of the addition of the surface active agent to the solution. In a second embodiment, the solution consists essentially of a surface active agent in a concentration sufficient to reduce the surface tension of the solution to the above range at the operating temperature of the solution. The surface active agent is preferably a perfluorinated hydrocarbon. The most preferred solutions have a pH below one, hydroxylamine as the reducing agent and a perfluorinated hydrocarbon surfactant conforming to one of the following formulae:

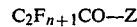

and

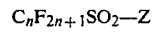

where n is an integer of from 3 through 10, and Z is a hydrophilic group.

DESCRIPTION OF THE PREFERRED EMBODIMENTS

As described above, the solutions comprise an aqueous solution of a reducing agent, a surface active agent and a pH adjustor, the surface active agent being present in an amount whereby the surface tension of the solution preferably does not exceed 50 dynes per square centimeter at the operating temperatue of the solution. The reducing agent used to reduce and/or remove the permanganate or hexavalent chromium residue is any aqueous soluble material capable of effecting reduction and removal. Suitable reducing agents for purposes of the invention include oxalates, aldehydes, formates, substituted and non-substituted hydroxylamines, substituted and non-substituted hydrazine, ascorbic acid, aminophenols, the mono and dihydric phenols, borohydrides, amine boranes, etc. The oxalates and formates are usually in the form of salts of the alkali earth and alkali metals, such as sodium, lithium and potassium. Examples of substituted hydroxylamines include phenylhydroxylamine and benzylhydroxylamine. An example of an aminophenol is Metol (1,4-methyl-p-aminophenol) and Elon (N-methyl-p-amino- phenolsulfate); an example of a substituted hydrazine is phenylhydrazine. Hydroxylamine reducing agents are preferred and unsubstituted hydroxylamine is the most preferred reducing agent.

The concentration of the reducing agent can vary within broad limits dependent upon the strength of the oxidizing solution, the redox potential of the reducing agent-oxidizing agent combination, the temperature of use, etc. A generalized concentration range for the reducing agent varies between about 0.1 and 150 grams per liter, and more preferably, between 2.5 and 25.0 grams per liter.

The reducing solution contains a pH adjustor to adjust the pH of the solution to that pH at which the redox potential is maximized. The pH, therefore, is dependent upon the particular reducing agent used in combination with the oxidizing agent and the most effective pH for that reducing agent. For example, the most effective pH for hydroxylamine, the preferred reducing agent in accordance with the invention, in combination with either a permanganate or hexavalent chromium solution, is less than 2, and more preferably, less than 1. Any suitable source of acid or base can be used to adjust pH to the desired range, mineral acids such as hydrochloric acid and sulfuric acid being suitable for the preferred hydroxylamine reducing agent.

The solutions preferably have a surface tension of less than 50 dynes per square centimeter at their operating temperature and more preferably, less than 40 dynes per square centimeter to enable the solution to infiltrate into the capillaries and remove oxidation solutions and residues. Surface tension is reduced to this level through addition to solution of a surface active agent selected so that it is non-interfering with the subsequent metal plating process. In this respect, the surface active agent should be compatible with the reducing agent, should not poison the surface of the part to be plated, should not leave a residue on the surface of the part that would interfere with the plating reaction and with adhesion of the plated metal to the surface of the part, should be active at the pH of the solution and should have good thermal stability.

Suitable surface agents for purposes of the invention include, by way of example, ethoxylated alcohols such as polyethylene glycol monooleate, ethoxylated nonyl phenol and polyglycol/glycol mixtures, ethoxylated oleyl alcohol, alkyl phenol polyethylene glycol ethers, polyoxyalkylated isostearyl alocohols, polyoxyethylene sorbitol oleate, etc.; sulfonates of alkylaryls such as dodecyldiphenyl ether disulfonic acid; ethoxylated amines and amides such as ethoxylated coco amine, ethoxylated soya amine, ethoxylated tallow amine, ethylene oxide condensates of fatty acid amides, etc.; glycerol esters such as glycerol monostearate, glycerol monooleate, ethylene glycol monostearate, etc.; phosphate esters; quaternarys such as dimethyl dicoco quaternary ammonium chloride, dimethyl dicoco quaternary ammonium chloride, trimethyl tallow ammonium chloride, trimethyl coco quaternary ammonium chloride, etc.; and the preferred fluorinated hydrocarbon surface active agents that will be discussed in greater detail below. The preferred surface active agent is an anionic or non-ionic agent though cationics may be useful to promote catalysis in cetain circumstances.

The most preferred surface active agent is a fluorinated hydrocarbon characterized by a stable fluorocarbon tail and a solubilizing group, Z. The solubilizing group can be organic or inorganic. A preferred species has the following spectrum of solubilities in acid media, in grams per 1,000 grams of solution: 12½% hydrochloric acid, >1; 37% hydrochloride acid, >0.1; 12½% nitric acid >1; 70% nitric acid, >5; 12½% phosphoric acid, >1; 85% phosphoric acid >1; 12½% sulfuric acid, 10; and 97% sulfuric acid, 0.5. Another preferred species has the following solubility spectrum: 12½% hydrochloric acid, <10; 12½% nitric acid, <20; and 12½ sulfuric acid, <10. Particularly useful fluorinated hydrocarbons of the type are sold under the tradename Fluorad by the Minnesota Mining and Manufacturing Company, St. Paul, Minnesota. The preferred species, described above, are designated Fluorad FC-95 and FC-98, respectively.

Illustrated fluorinated hydrocarbons have a formula selected from the group consisting of:

$$C_2F_{n+1}CO-Z$$

and $$C_nF_{2n+1}SO_2-Z$$

where n is an integer of from 3 through 10, and Z is a hydrophilic group. Typically such compounds are composed of molecules containing a perfluorinated lipophilic portion and a hydrophilic portion. The fluorocarbon portion of the molecule advantageously contains either 3 or 7 carbon atoms where the material is a perfluorocarboxylic acid derivative, and 8 or 10 carbon atoms where the material is a perfluorosulfonic acid derivative. Thus certain of such compounds have the formula:

$$C_3F_7CO-Z$$

$$C_7F_{15}CO-Z$$

$$C_8F_{17}SO_2-Z$$

$$C_{10}F_{21}SO_2-Z$$

where Z is as identified above.

The hydrophilic portion of the fluorocarbon can be any typical hydrophilic group such as hydroxyl, alkali metal or alkaline earth metal substituted hydroxyl, and alkali metal group, and ammonium group, amine groups, substituted amine groups, substituted amine groups, quarternary ammonium salts, amide and substituted amide groups and the like.

Typical examples of fluorinated hydrocarbon sulfonic acids follow:
Perfluoro butyl sulfonic acid
Perfluoro isoamyl sulfonic acid
Perfluoro n-hexyl sulfonic acid
Perfluoro n-heptyl sulfonic acid
Perfluoro n-octyl sulfonic acid
Perfluoro n-decyl sulfonic acid
Perfluoro n-lauryl sulfonic acid
Perfluoro cyclohexane sulfonic acid
Perfluoro (4-methyl cyclohexane) sulfonic acid
Perfluoro cyclohexane methyl alpha-sulfonic acid
Perfluoro dimethyl cyclohexane sulfonic acids
Perfluoro ethyl cyclohexane sulfonic acid
Perfluoro isopropyl cyclohexane sulfonic acid
Perfluoro diethyl cyclohexane sulfonic acids
Perfluoro di(cyclohexane) sulfonic acids
Perfluoro di-(cyclohexane) di-sulfonic acids
Perfluoro naphthalene di-sulfonic acids
Perfluoro naphthalene sulfonic acids
Obviously, carboxylic acids can be substituted for the sulfonic acid above.

The concentration of the surface active agent in solution is that amount sufficient to lower the surface tension of the solution to a level whereby oxidant is removed from capillaries and preferably, in an amount sufficient to lower the surface tension to no more than 50 dynes per square centimeter at the operating temperature of the solution and more preferably, to a surface tension ranging between 15 and 40 dynes per square centimeter. The preferred surface active agents are those that are able to reduce surface tension at a low concentration level. Preferably, the low surface tension is achieved at a concentration of surface active agent varying between 0.1 and 10 grams per liter of solution and more preferably, at a concentration varying between 0.20 and 5.0 grams per liter of solution.

The solutions are used in a metal plating process subsequent to a step of contacting a plastic substrate with an oxidizing solution selected from the group of hexavalent chromium and permanganate solutions. Such oxidizing solutions are most often used in the metallization of ABS, but are also used in the metal plating of epoxy resins, polyesters, polyamides including nylon, polycarbonates, polysulfones, polystyrene including polystyrene blends such as a blend of polystyrene with a polycarbonate, etc. They are also used in the formation of printed circuits where a printed circuit substrate, with or without through-holes, such as a phenolic or glass filled epoxy, is contacted with the oxidizing solution to remove drill smear and enhance adhesion.

The solutions are especially useful in the plating of foamed plastics, particularly a foamed blend of ABS and polyphenylene ether, foamed polycarbonate, foamed polystyrene, foamed ABS, foamed polyester, etc.

The reducing solutions are used in a conventional process for electrodes plating using a step of oxidation with either a hexavalent chromium or a permangante solution modified only by treatment of the plastic with the reducing solution of the invention following the step of oxidation. Preferred operating temperatures vary from room temperature to about 150° F. and more preferably, from about 100° F. to 130° F.

A frequently used, but not mandatory first step in a plating sequence for plating plastics comprises contact of the plastic with a solvent solution for the plastic to solvate its surface whereby a subsequent treatment solution can better penetrate the surface of the plastic. Solvent pre-treatment of ABS is the subject of U.S. Pat. Nos. 3,445,350 and 3,769,061. Solvent pre-treatment of an epoxy resin is disclosed in co-pending U.S. patent application Ser. No. 542,036 filed Oct. 14, 1983 and assigned to the same assignee as the subject application. Solvent pre-treatment of a variety of plastics is the subject of U.S. Pat. No. 3,574,070. The aforesaid patents and application are incorporated herein by reference for their disclosure of solvent solutions and treatment conditions.

Following solvent treatment, the plastic is treated with an oxidizing solution often referred to in the art as chemical etchant. Suitable hexavalent chromium treatment solutions are set forth below.

Example 1 (from U.S. Pat. No. 3,142,581)

Sodium dichromate (mol %): 0.4
Sulfuric acid (mol %): 47.6
Water: to 1 liter

Example 2 (from U.S. Pat. No. 3,445,350)

Sodium dichromate (parts by weight): 102
Sulfuric acid (95.5%-parts by weight): 2,930
Phosphoric acid (parts by weight): 1,825
Water (parts by weight): 1,020

Example 3 (from U.S. Pat. No. 3,708,430)

Chromium trioxide (kilograms): 1.22
Trivalent chromium (grams): >28.5
Water: to 1 liter Conditions of use for the aforesaid solutions as well as the method of manufacture of the same are set forth in the aforesaid patents.

Suitable permanganate solutions for use in the process of the subject invention are set forth below:

Example 4 (from U.S. Pat. No. 4,042,729)

Potassium permanganate (grams): 40
Potassium hydroxide (45%): to pH 12.5
Water: to 1 liter Example 5 (from co-pending application Ser. No. 542,036)

Potassium permanganate (grams): 40
Sodium hydroxide (grams): 30
Surfactant (grams): 0.5
Water: to 1 liter Conditions of use and the method of making the aforesaid permanganate solutions are as disclosed in the above referenced patent and application. The preferred formulation for purposes of this invention is as set forth in example 5.

Following the step of oxidation and water rinsing, the part is treated with the solutions. Conditions of use are dependent upon the strength of the reducing agent, the amount of oxidation residue left on the surface of the plastic part and the nature of the plastic. In general, contact of a plastic having oxidation residue with the reducing solution may be by either immersion or spraying, though immersion is preferred, for a time varying between about 1 and 20 minutes and more preferably, between 5 and 10 minutes at a temperature varying between room temperature and 200° F., and preferably, at a temperature varying between about 130° F. and 160° F.

The reducing solution does not appear to interfere with the plating steps that follow in the processing sequence such as catalysis and electroless metal plating over the plastic part. Plating is rapid and complete following the process of the subject invention. Moreover, the treatment solutions remove oxidation solution and residues from capillaries such as pores in the plastic and interstices between the metal and plastisol coating of racks. Accordingly, using the solutions of the invention, the incidence of void formation is significantly reduced. When the surface active agent is non-ionic or anionic, metal plating on racks carrying the parts through the sequence is significantly retarded.

Throughout the description of the invention, the solution is referred to as a solution of a reducing agent. However, it is believed that more is involved in the removal process than a simple step of reduction and it has been found that though the reducing agent is desirable, the improved results obtained are not obtained in the absence of the surface active agent which contributes to the removal process. In this respect, it has been found that a plastic part can be contacted with a solution of a reducing agent and a separate solution of the surface active agent, though this constitutes a lesser preferred embodiment of the invention. Moreover, it has been found that if a plastic part is treated only with a solution of a reducing agent or a solution of a surface active agent, better results are obtained with the solution of the surface active agent than with the solution of the reducing agent and therefore, the invention includes within its scope, the step of contacting the plastic part with a solution consisting only of the surface active agent to remove oxidant solution and residue from capillaries.

Following the pre-treatment sequence described above, the plastic part is ready for plating in accordance with art recognized procedures. The first step involves catalysis of the part to render it receptive to electroless deposition. A suitable plating catalyst is catalytic palladium used at room temperature for from 5 to 10 minutes such as that catalyst sold under the trademark Cuposit Catalyst 6F of Shipley Company Inc. of Newton, Mass. The next step comprises acceleration to activate the catalyst such as by immersion in a perchloric acid solution for about 2 minutes. Thereafter, the part is metal plated such as with an electroless copper or nickel deposition solution for a contact time dependent upon the thickness of the metal plate desired. A typical electroless copper plating solution comprises dissolved copper, formaldehyde, complexing agent and pH adjuster.

The invention will be better understood with reference to the following examples.

EXAMPLE 6

For this example, the plastic part treated was a smooth ABS resin carried through the plating sequence on the metal prongs of a plating rack extending from plastisol coated racks stripped of plastisol at the ends holding the ABS part. All solutions used are available from Shipley Company Inc. of Newton, Mass. The treatment sequence used is as follows:

a. immerse in a hexavalent chromium oxidizing solution identified as PM 940 maintained at 150° F. for 10 minutes and water rinse;

b. immerse in a solution having the composition set below for 2 minutes maintained at a temperature of 125° F.:

Hydroxylamine sulfate: 5 grams
Sulfuric acid (50% by volume): 100 mls
FC-98 fluorinated hydrocarbon: 1 gram
Water: to 1 liter
and water rinse;

c. immerse in PM-958 catalyst for 2 minutes at 125° F. and water rinse;

d. immerse in PM-964 accelerator for 1½ minute at 120° F. and water rinse; and e. immerse in PM-994 electroless copper plating solution for 6 minutes at 105° F. and water rinse.

The ABS part was examined following the above procedure and was found to be completely covered with copper over 100 percent of its surface. Repeating the procedure 20 times gives the same results. Repeating the procedure 20 times omitting the step of treatment with the reducing solution (step b) would result in several parts showing small voids in the metal coating adjacent the point of contact between the part and the metal prong of the rack.

EXAMPLE 7

The procedure of example 6 may be repeated substituting a permanganate solution for the hexavalent chromium solution in step a of the example. In addition, preceding the contact of the part with the permanganate solution, the part should first be contacted with a solution of a solvent. A suitable permanganate solution would have the following formulation:

Potassium permanganate: 50 grams
Sodium hydroxide: 35 grams
Surfactant: 1 gram
Water: to 1 liter The results obtained with respect to oxidation related problems would be similar to the results obtained for Example 6.

EXAMPLE 8

The procedures of example 6 were repeated substituting a foamed blend of ABS and polyphenylene ether for the smooth ABS. Of 20 parts processed using the hydroxylamine solution, all had 100% coverage with no voids. Of 20 parts processed omitting the step of contacting the part with the reducing solution, voids were found on all parts.

EXAMPLES 9 to 13

The procedure of Example 8, using the solution of the reducing agent, may be repeated substituting the following surface active agents in equivalent amounts for FC-98.

| Example No. | Surfactant | Source |
|---|---|---|
| 9 | Dowfax Z AL, a sodium salt of disulfonated dodedecyl-diphenyl oxide. | Dow Chemical Co. |
| 10 | Dowfax Z AO, dodecyl diphenyl ether disulfonic acid | Dow Chemical Co. |
| 11 | Igepal LO-997, nonylphenoxy poly(ethyleneoxy)ethanol | GAF Corporation |
| 12 | Lutensol AP-10, Alkylphenol ethylene oxide | BASF Corporation |
| 13 | Cyastat SN (50% solution), stearamidopropyl dimethyl-B-hydroxy ethyl NH$_4$NO$_3$ | American Cyanamid Co |

In all cases, 100% copper coverage would be obtained over the foamed plastic.

EXAMPLE 14

The procedure of Example 6 was repeated, but the hydroxylamine sulfate was omitted from the reducing solution so that the major constituent in the treatment solution was the surface active agent. None of the parts had voids when first treated with the solution of the surface active agent.

We claim:

1. A process for the metallization of a plastic by electroless deposition including the step of treating the plastic with a liquid solution of an oxidant selected from the group consisting of hexavalent chromium solutions and permanganate solutions prior to the metallization of the plastic, said process comprising contact of the plastic subsequent to treatment with the oxidant and prior to the steps of catalyzation and metallization with a solution consisting essentially of a surface active agent in a concentration sufficient to reduce the surface tension of said solution to 50 dynes per square centimeter or less at the operating temperature of the solution.

2. The process of claim 1 where the surface tension is reduced to between 15 and 40 dynes per square centimeter at an operating temperature of at least 100° C.

3. The process of claim 1 where the pH of the solution is less then 1.

4. The process of claim 1 where the surface active agent is an anionic or non-ionic agent.

5. The process of claim 1 where the surface active agent is selected from the group consisting of alkyl sulfonates, sulfonated amines and amides, carboxylated alcohol ethoxylates, diphenyl sulfonate derivatives, ethoxylated alcohols, ethoxylated amines and amides, fluorocarbons, olefin sulfonates, phosphate esters, quaternary amines, sulfates and sulfonates of ethoxylated alkyl phenols, sulfonates of alkylaryls and sulfonates of naphthalene and alkyl naphthalenes.

6. The process of claim 1 where the surface active agent is a perfluorinated hydrocarbon.

7. The process of claim 6 where the perfluorinated hydrocarbon conforms to the general formula:

$$C_nF_{n+1}CO-Z$$

or $$C_nF_{2n+1}SO_2-Z$$

where n in each formula is a positive integer varying between 3 and 10 and Z is a hydrophilic group.

8. The process of claim 7 where the perflorinated hydrocarbon conforms to the general formula:

$$C_3F_7CO-Z,$$

$$C_7F_{15}CO-Z,$$

$$C_8F_{17}SO_2-Z, \text{ or}$$

$$C_{10}F_{21}SO_2-Z$$

where Z is a hydrophilic group.

9. The process of claim 7 where Z is selected from the group consisting of alkali metal, alkaline earth metal, hydroxyl, an ammonium group, an unsubstituted and substituted amine group, a quaternary ammonium salt, and a substituted and unsubstituted amide group.

10. The process of claim 7 where Z is hydroxyl.

11. The process of claim 6 where the concentration of the perfluorinated hydrocarbon varies between 0.01 grams per liter of solution and its solubility limit.

12. The process of claim 11 where the concentration of the hydrocarbon varies between 0.20 and 5.0 grams per liter of solution.

13. The process of claim 6 where the plastic treated is a foamed plastic.

14. The process of claim 6 where the plastic is hung on racks during processing which racks have interstices in contact with treatment solutions, said interstices comprising spaces between a metal core and a plastisol coating.

15. The process of claim 6 including the step of contact of the plastic part with a solution of a reducing agent prior to or subsequent to the step of treatment with the solution of the surface active agent.

16. The process of claim 15 where the reducing agent is a solution of hydroxylamine in acid media.

* * * * *